(12) United States Patent
Oota et al.

(10) Patent No.: US 11,631,905 B2
(45) Date of Patent: Apr. 18, 2023

(54) BATTERY MODULE (71) Applicant: Yazaki Corporation, Tokyo (JP)

(72) Inventors: Takao Oota, Shizuoka (JP); Yoshiki Aoshima, Shizuoka (JP); Kazuya Harakawa, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 190 days.

(21) Appl. No.: 16/450,121

(22) Filed: Jun. 24, 2019

(65) Prior Publication Data
US 2020/0006814 A1 Jan. 2, 2020

(30) Foreign Application Priority Data

Jun. 27, 2018 (JP) .............................. JP2018-121830

(51) Int. Cl.
| | | |
|---|---|---|
| H01M 10/42 | (2006.01) | |
| H01M 10/48 | (2006.01) | |
| H01M 50/209 | (2021.01) | |
| H01M 50/519 | (2021.01) | |
| H01M 50/569 | (2021.01) | |

(52) U.S. Cl.
CPC ..... *H01M 10/4257* (2013.01); *H01M 10/482* (2013.01); *H01M 50/209* (2021.01);
(Continued)

(58) Field of Classification Search
CPC ........... H01M 10/425; H01M 10/4257; H01M 10/4271; H01M 10/4278; H01M 10/4207;
(Continued)

(56) References Cited

U.S. PATENT DOCUMENTS

2014/0335378 A1* 11/2014 Kuroda ............... H01M 50/325
429/7
2017/0179458 A1 6/2017 Sato et al.
(Continued)

FOREIGN PATENT DOCUMENTS

JP 2004273351 * 9/2004 ............. Y02E 60/10
JP 2004273351 A 9/2004
(Continued)

OTHER PUBLICATIONS

Machine translation of JP2004273351 originally published to Nissan Motor Co. Ltd. on Sep. 30, 2004. (Year: 2004).*
(Continued)

*Primary Examiner* — Nicholas P D'Aniello
*Assistant Examiner* — Mary G Henshaw
(74) *Attorney, Agent, or Firm* — Sughrue Mion, PLLC (57) ABSTRACT

A battery module includes battery cells being arrayed, a cell-monitoring unit configured to monitor each battery cell of the battery module, a battery cell side circuit board electrically connected to the battery cells, and a cell-monitoring unit side circuit board electrically connected to the cell-monitoring unit and the battery cell side circuit board. The battery cell side circuit board and the cell-monitoring unit side circuit board are connected to each other and voltage detection lines on the battery cell side circuit board and a voltage detection lines on the cell-monitoring unit side circuit board are electrically connected. The electric circuits of the voltage detection lines on the battery cell side circuit board are aligned in order of their electric potentials and the electric circuits of the voltage detection lines on the cell-monitoring unit side circuit board are aligned in order of their electric potentials.

6 Claims, 5 Drawing Sheets (52) U.S. Cl.
CPC ....... *H01M 50/519* (2021.01); *H01M 50/569* (2021.01); *H01M 2220/20* (2013.01)

(58) Field of Classification Search
CPC ......... H01M 10/4264; H01M 10/4285; H01M 50/20; H01M 2220/20; H01M 2010/4262; H01M 50/569; H01M 50/50; H01M 50/519; H01M 50/209; H01M 10/482
See application file for complete search history.

(56) References Cited

U.S. PATENT DOCUMENTS

| | | | |
|---|---|---|---|
| 2018/0315967 A1* | 11/2018 | Miyawaki | ............ H01M 50/20 |
| 2019/0033387 A1 | 1/2019 | Ito et al. | |
| 2020/0020919 A1* | 1/2020 | Makino | ............... H01M 10/425 |

FOREIGN PATENT DOCUMENTS

| | | | | |
|---|---|---|---|---|
| JP | 2010-283918 A | | 12/2010 | |
| JP | 2017022139 | * | 1/2017 | ............ Y02E 60/10 |
| JP | 6086317 B2 | | 3/2017 | |
| JP | 2017-112066 A | | 6/2017 | |
| JP | 6258437 B2 | | 1/2018 | |
| JP | 2019029173 A | | 2/2019 | |

OTHER PUBLICATIONS

Machine translation of JP2017022139 originally published to Nippon Mektron Ltd. on Jan. 26, 2017. (Year: 2017).*

* cited by examiner

BATTERY MODULE

CROSS REFERENCE TO RELATED APPLICATION

This application is based upon and claims the benefit of priority from the prior Japanese Patent Application No. 2018-121830, filed on Jun. 27, 2018, the entire contents of which are incorporated herein by reference.

BACKGROUND

Technical Field

The disclosure relates to a battery module having a cell-monitoring unit that monitors states of a plurality of battery cells.

Related Art

JP 2010-283918 A discloses a battery module for an electric vehicle. This battery module for electric vehicles includes a plurality of battery cells tandemly arrayed, a cell-monitoring unit for monitoring the state of voltage etc. of the plurality of battery cells, and a communication line. In the battery module including the plurality of battery cells in which the positive electrode terminal and the negative electrode terminal are arranged at a distance in each battery cell, and being connected in series, bus bars including a connection portion which fix and electrically connect adjacent electrode terminals are arranged alternately at separate positions. In the battery module in which the plurality of battery cells is connected in series, the voltage of the bus bar increases sequentially from one side of the circuit. Furthermore, it is necessary to connect voltage detection lines to an IC input section of the cell-monitoring unit in a state in which electric potential of respective bus bars detected by the voltage detection lines are arranged in order. Therefore, when the voltage detection lines are linearly extended from the bus bars to connectors of the IC input section, the arrangement of the voltage detection lines is not aligned in order of their electric potential and cannot be connected to the IC input section as it is.

When electric wires are used as the voltage detection lines, it is possible to wire the electric wires three-dimensionally, and it is possible to rearrange the electric wires to align in order of their electric potential. However, in this case, the total weight was bulky and their size was large.

In order to deal with above mentioned problems, a device in which adjacent electrode terminals of a battery module are connected by bus bars and a flat cable is disclosed in JP 2017-112066 A. However, in this case, since the flat cable can only be arranged two-dimensionally, a circuit became complicated by providing a circuit or the like for rearranging voltage detection lines in order of their electric potential in the cell monitoring unit side.

SUMMARY

The disclosure is directed to a battery module capable of achieving thinning and weight reduction of the battery module and capable of achieving simple and reliable wiring to the cell-monitoring unit.

A battery module includes a plurality of battery cells being arrayed, a cell-monitoring unit being electrically connected to the plurality of battery cells and configured to monitor each battery cell of the plurality of battery cells, a circuit board on the battery cell side being electrically connected to the plurality of battery cells as a wiring member, and a circuit board on the cell-monitoring unit side being electrically connected to the cell-monitoring unit and the circuit board on the battery cell side as a wiring member. The circuit board on the battery cell side and the circuit board on the cell-monitoring unit side are connected to each other and a plurality of voltage detection lines on the circuit board on the battery cell side and a plurality of voltage detection lines on the circuit board on the cell-monitoring unit side are electrically connected. The electric circuits of the voltage detection lines on the circuit board on the battery cell side are aligned in order of electric potentials and the electric circuits of the voltage detection lines on the circuit board on the cell-monitoring unit side are aligned in order of electric potentials.

According to the above configuration, it is possible to provide a battery module capable of simple and reliable wiring to a cell-monitoring unit and capable of achieving thinning and weight reduction of whole battery module by employing a circuit board such as a flexible printed wiring board as a wiring material between the cell-monitoring unit and a plurality of battery cells.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Description will be hereinbelow provided for embodiments of the present invention by referring to the drawings. It should be noted that the same or similar parts and components throughout the drawings will be denoted by the same or similar reference signs, and that descriptions for such parts and components will be omitted or simplified. In addition, it should be noted that the drawings are schematic and therefore different from the actual ones.

Figure 1:
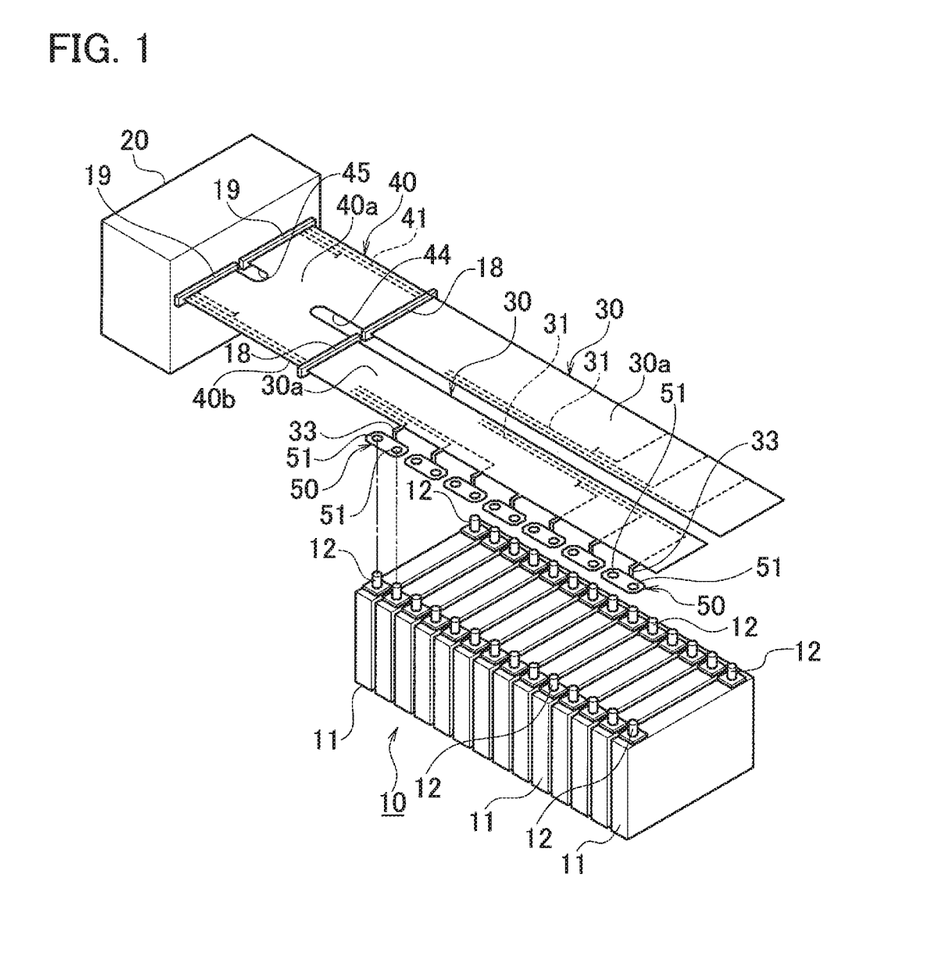
FIG. 1 is an exploded perspective view illustrating a battery module of first embodiment.
Figure 2:
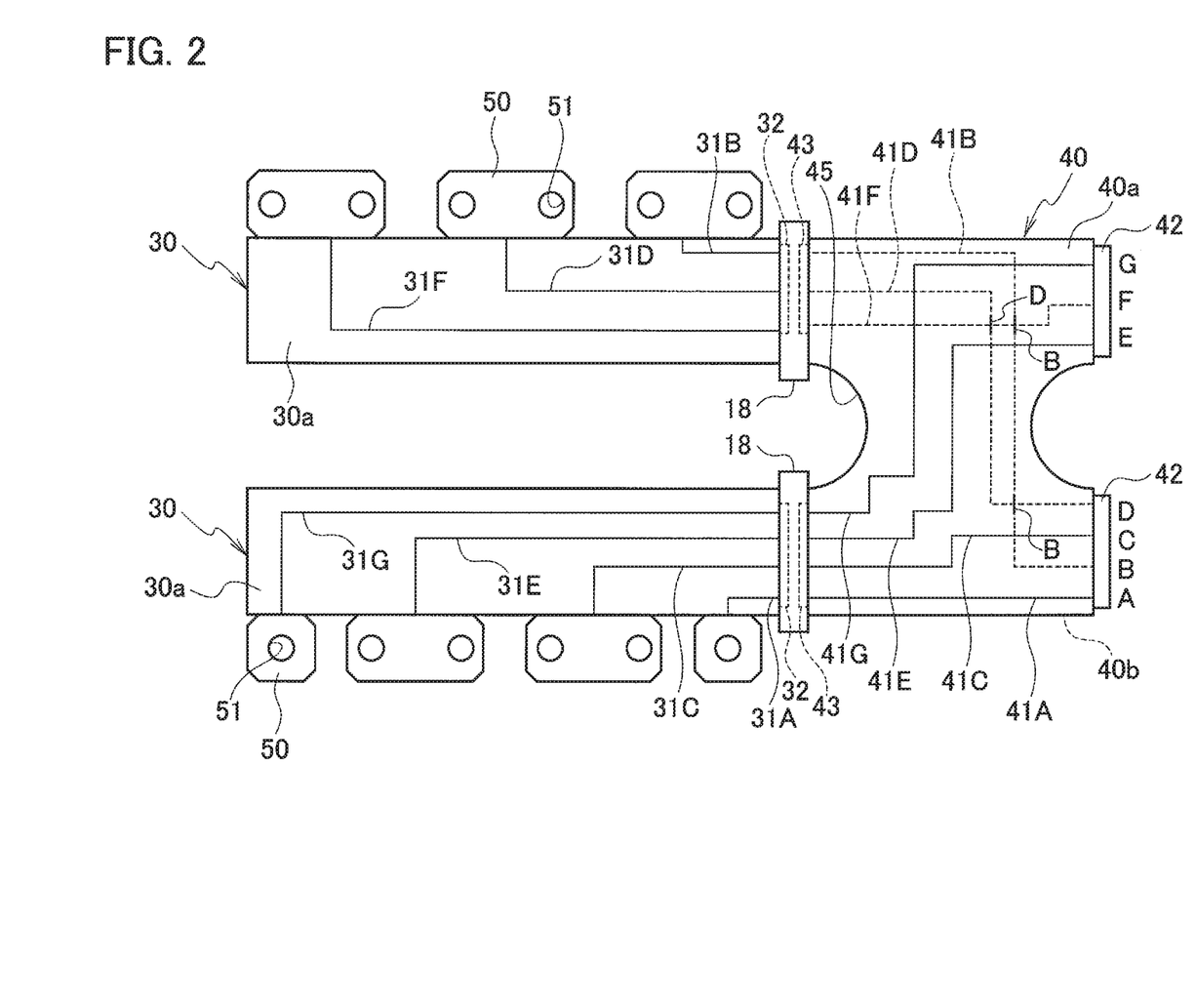
FIG. 2 is a plan view schematically illustrating a flexible printed wiring board employed in the battery module.
Figure 3:
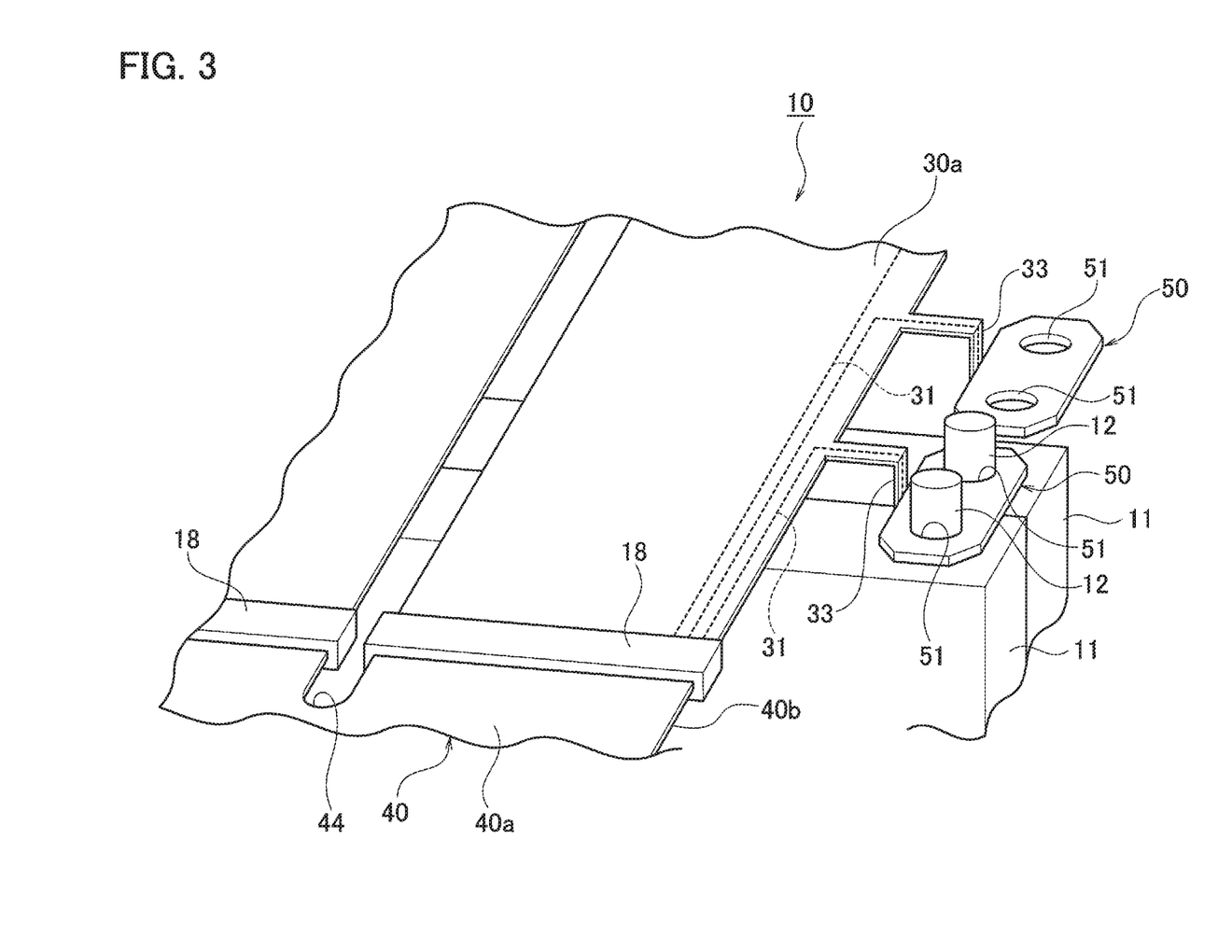
FIG. 3 is a partial perspective view of an essential part of the battery module.

FIG. 1 is an exploded perspective view illustrating a battery module of first embodiment, FIG. 2 is a plan view schematically illustrating a flexible printed wiring board employed in the battery module, and FIG. 3 is a partial perspective view of an essential part of the battery module.

As shown in FIG. 1, the battery module 10 includes a plurality of battery cells 11, a cell-monitoring unit (CMU) 20, a flexible printed wiring board 30 which is a circuit board (wiring member) on the battery cell side, and a flexible printed wiring board 40 which is a circuit board (wiring member) on a cell-monitoring unit side. The plurality of battery cells 11 are each chargeable, respectively, and are tandemly arrayed in the battery module 10. The cell-monitoring unit 20 is disposed adjacent to the upper surface side of the plurality of battery cells 11 and monitors state of each battery cell 11 by measuring a voltage or the like. The flexible printed wiring board 30 is arranged on the upper surface side of the plurality of battery cells 11. Each of the wiring patterns included in a plurality of wiring patterns 31 formed on the flexible printed wiring board 30 is wired to be capable of measuring voltage between the positive and negative electrode terminals 12, 12 of each of the battery cells 11 included in the plurality of battery cells 11. One end of the flexible printed wiring board 40 is electrically connected to the plurality of wiring patterns 31 of the flexible printed wiring board 30 via a connector 18 and the other end is electrically connected to the cell-monitoring unit 20 via a connector 19. The battery module 10 is a battery pack mounted on an electric-powered vehicle such as an electric vehicle (EV) or a hybrid electric vehicle (HEV).

In each battery cell 11, positive and negative electrode terminals 12, 12 are provided at both ends on the upper surface. In the battery module 10, in a state where a plurality of battery cells 11 are tandemly arrayed, the electrode terminals 12 are arranged in two rows on the upper surface side of the plurality of battery cells 11. The electrode terminals 12 in each row are arranged such that adjacent electrode terminals 12, 12 have different polarities so that adjacent battery cells 11 can be connected in series. As shown in FIG. 2, the flexible printed wiring board 30 as a circuit board on the battery cell side is dividedly formed into a pair so as to adapt to each row of the electrode terminals 12, 12 of the plurality of battery cells 11. On one surface 30a of the flexible printed wiring board 30, a plurality of wiring patterns (electric circuits) 31A to 31G corresponding to each battery cell 11 are formed, respectively. In FIG. 1 and FIG. 3, each wiring pattern is denoted as reference sign 31. That is, the flexible printed wiring board 30 is manufactured by forming an electric circuit of conductive metal such as copper foil or the like on one side of a thin base film having insulating property and flexibility such as polyimide, and by bonding a film-like cover of polyimide or the like on the one side of the thin base film with an adhesive. The wiring patterns 31 (31A to 31G) formed on the one side 30a of the flexible printed wiring board 30 are wired to be capable of measuring a voltage of each battery cells 11 with the cell-monitoring unit 20.

As illustrated in FIGS. 1 and 3, a pair of flexible printed wiring boards 30, 30 arranged on the battery cell side is wired linearly from respective battery cells 11 toward the cell-monitoring unit 20 side.

As shown in FIG. 2, on one end side of each flexible printed wiring board 30 of a pair of flexible printed wiring boards 30, 30, a connecting part 32 being connected to corresponding connectors 18 is provided.

Further, as shown in FIGS. 1 and 3, each flexible printed wiring board 30 of the pair of flexible printed wiring boards 30, 30 is provided with a plurality of battery connecting parts 33 protruding as one member from one side in the width direction of the flexible printed wiring board 30 at positions capable of being connected to the electrode terminals 12, 12 in each row of the electrode terminals. Each wiring pattern 31 of the wiring patterns 31 wired linearly on one side 30a of each flexible printed wiring board 30 extends from each connecting portion 32 to a base end portion of each battery connecting portion 33, and electrically connected to respective battery connecting portions 33. The tip end portion of each battery connecting portion 33 is soldered and electrically connected to a rectangular plate-shaped bus bar 50 in which a pair of round holes 51, 51 are fitted to electrode terminals 12, 12 having different polarities of adjacent battery cells 11, 11. A plurality of the bus bars 50 arranged on one side in the width direction of each of the flexible printed wiring boards 30 of the pair of flexible printed wiring boards 30, 30 are soldered to the corresponding battery connecting portions 33 and alternately arranged on both sides of the pair of flexible printed wiring boards 30, 30 so that the plurality of battery cells 11 can be connected in series.

As shown in FIG. 2, a plurality of wiring patterns 41 is wired on the flexible printed wiring board 40. The plurality of wiring patterns 41 wired on one surface 40a of the flexible printed wiring board 40 is electric circuits connected to respective wiring patterns 31 of one of the pair of flexible printed wiring boards 30, 30 on the battery cell side. The plurality of wiring patterns 41 wired on the other surface 40b of the flexible printed wiring board 40 is electric circuits connected to respective wiring patterns 31 of the other flexible printed wiring boards 30 of the pair of flexible printed wiring boards 30, 30. That is, a plurality of wiring patterns 41A to 41G is respectively formed on the front surface and the back surface of the flexible printed wiring board 40. In FIG. 1, a plurality of wiring patterns 41A to 41G is indicated collectively by reference sign 41. The flexible printed wiring board 40 is manufactured by forming wiring patterns formed of conductive metal such as copper foil on both surfaces of a thin base film having insulating property and flexibility such as polyimide, and adhering a film-like cover of polyimide or the like with an adhesive on each surface of the thin base film. The wiring patterns formed on both surfaces 40a and 40b of the flexible printed wiring board 40 are wirings for measuring the voltage of the battery cell 11 with the cell-monitoring unit 20.

The wiring patterns 41 are wired so as to be directly connectable without changing the arrangement before connecting to the IC input section (not shown) in the cell-monitoring unit 20. The electric circuit of the flexible printed wiring board 30 on the battery cell side and the electric circuit of the flexible printed wiring board 40 on the unit side are electrically connected. Specifically, the electric circuits 31A to 31G of the voltage detection line of the flexible printed wiring board 30 on the battery cell side are connected to the electric circuits 41A to 41G of the voltage detection line of the flexible printed wiring board 40 on the unit side, respectively. In the flexible printed wiring board 30 on the battery cell side and the flexible printed wiring board 40 on the unit side, the wiring patterns 31A to 31G, 41A to 41G of the voltage detection line are aligned in order of electric potential in a state connected to the battery cell 11.

More specifically, the wiring patterns 31A, 31C, 31E, and 31G are the voltage detection lines for one row of the two rows separately formed by the electrode terminals 12 of the plurality of battery cells 11, and the wiring patterns 31A, 31C, 31E, and 31G are electrically connected to the wiring patterns 41A, 41C, 41E, and 41G on the front surface 40a of the unit-side flexible printed wiring board 40, respectively.

Further, the wiring patterns 31B, 31D, and 31F are the voltage detection lines for the other row of the two rows separately formed by the electrode terminals 12 of the plurality of battery cells 11, and the wiring patterns 31B, 31D, and 31F are electrically connected to the wiring patterns 41B, 41D, and 41F on the back surface 40b of the unit-side flexible printed wiring board 40, respectively. As shown in FIG. 2, the wiring patterns 41B, 41D and 41F arranged on the back surface 40b of the flexible printed wiring board 40 includes intersecting parts B, B formed between the wiring patterns 41B and 41D and between wiring patterns 41B and 41F and an intersecting part D formed between the wiring patterns 41D and 41F. The intersecting parts B and D are partly formed on the front surface 40a.

As shown in FIGS. 1 and 2, a pair of connecting portions 42, 42 provided on one end side of the flexible printed wiring board 40 on the cell-monitoring unit side is electrically connected to the cell-monitoring unit 20 via a pair of connectors 19, 19. As shown in FIGS. 2 and 3, a pair of connecting portions 43, 43 provided on the other end side of the flexible printed wiring board 40 is electrically connected to the pair of connecting portions 32, 32 provided on one end side of the pair of flexible printed wiring boards 30, 30 via the pair of connectors 18, 18. As shown in FIGS. 1 to 3, long and short U-shaped slit-like cutouts 44, 45 are formed at a center on both end sides of the flexible printed wiring board 40, making it easy to connect to the respective connectors 18, 18 and 19, 19.

Incidentally, the cell-monitoring unit 20 is disposed on the front side (the side closest to the cell-monitoring unit 20) of the plurality of battery cells 11 and includes a voltage measuring circuit (not shown) capable of measuring the voltage of each battery cell 11 and a power supply circuit (not shown) capable of converting the high voltage to a voltage suitable for a CPU (processing unit) or the like. Further, the cell-monitoring unit 20 is connected to a battery control unit (MPU) (not shown) and control the battery module 10 in view of the monitoring result.

According to the battery module 10 of the first embodiment, as shown in FIG. 2, since the flexible printed wiring board 30 on the battery cell side and the flexible printed wiring board 40 on the cell-monitoring unit side which have the wiring patterns 31A to 31G and 41A to 41G aligned in order of respective electric potential are used, these voltage detection lines can be directly connected to the IC input section of the cell-monitoring unit 20.

Since the arrangement of the wiring patterns 31A to 31G and 41A to 41G as the voltage detection lines of the respective flexible printed wiring boards 30, 40 have been aligned in advance in order of their electric potential so that it can be directly connected to the IC input part in the cell-monitoring unit 20, it is possible to reduce the thickness of substrates in the cell-monitoring unit 20 by omitting the reordering of the voltage detection lines in the unit 20, and as a result, it is possible to reduce the size of the cell-monitoring unit 20 itself and simplify the manufacturing of the cell-monitoring unit 20.

Further, since the plurality of battery cells 11 and the cell-monitoring unit 20 are electrically connected to the respective flexible printed wiring boards 30, 40 via the connectors 18, 19, the entire battery module 10 is capable of reducing its thickness and weight.

Moreover, by using the flexible printed wiring board 40 in which a plurality of wiring patterns 41A to 41G are formed on respective surfaces 40a, 40b as the circuit board to be wired to the cell-monitoring unit 20 side, even when two-dimensional wirings are employed, the cell-monitoring unit 20 and the flexible printed wiring board 40 can be easily and reliably connected. Therefore, it is possible to make the substrate (not shown) arranged in the cell-monitoring unit 20 to be thin and flexible.

Figure 4:
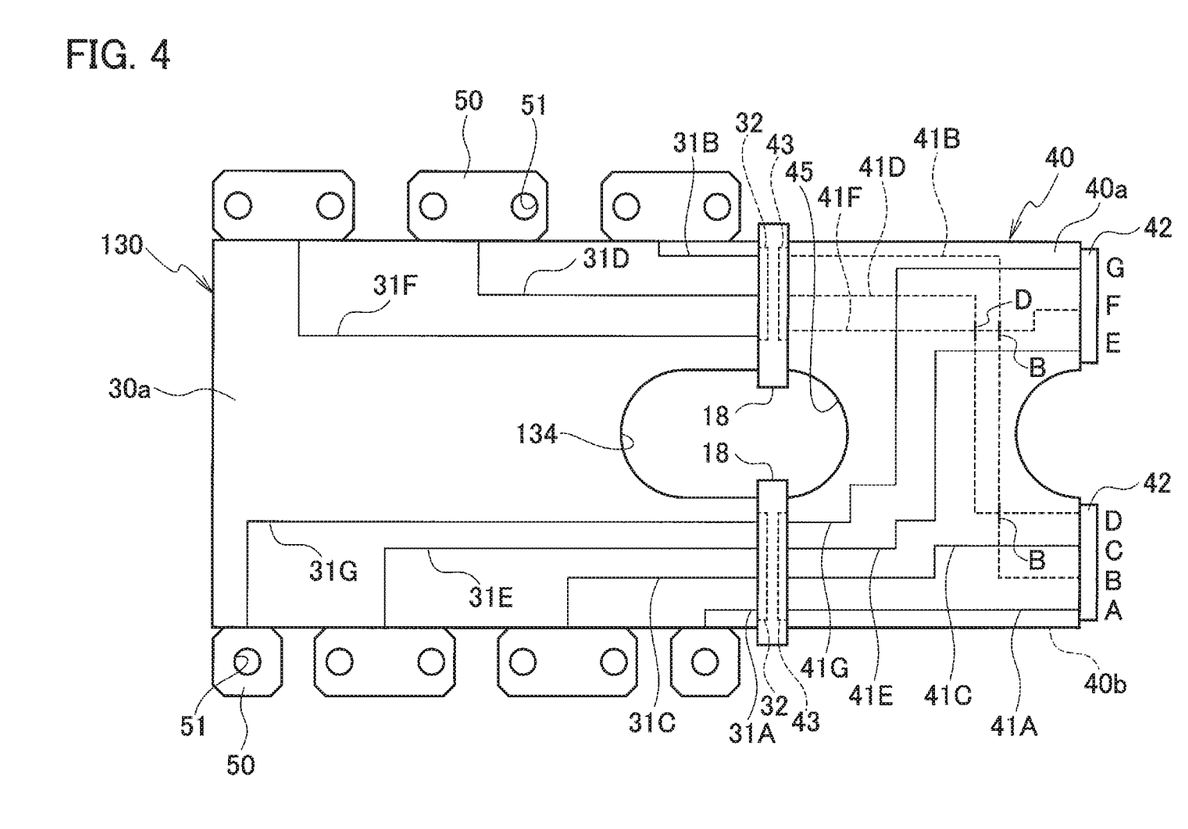
FIG. 4 is a plan view schematically illustrating a variation of the flexible printed wiring board.

FIG. 4 is a plan view schematically illustrating a variation of the flexible printed wiring board.

A flexible printed wiring board 130 on the battery cell side according to this variation differs from the pair of cell-side flexible printed wiring boards 30, 30 of the first embodiment in that the flexible printed wiring board 130 is formed to extend across the two rows separately arranged by the electrode terminals 12 of the plurality of battery cells 11 instead of being separately formed in pair like the flexible printed wiring boards 30, 30. A short U-shaped slit-like cutout 134 is formed at the center of one end side of the flexible printed wiring board 130, and other configurations are the same as those of the pair of cell-side flexible printed wiring boards 30, 30 in the first embodiment, same reference signs are attached to the same constituent parts, and a detailed description thereof will be omitted.

In the variation of the flexible printed wiring board 130, similar to the pair of flexible printed wiring boards 30, 30 of the first embodiment, since the plurality of battery cells 11 and the cell-monitoring unit 20 are electrically connected to the respective flexible printed wiring boards 130, 40 via the connectors 18, 19, the entire battery module 10 is capable of reducing its thickness and weight.

Figure 5:
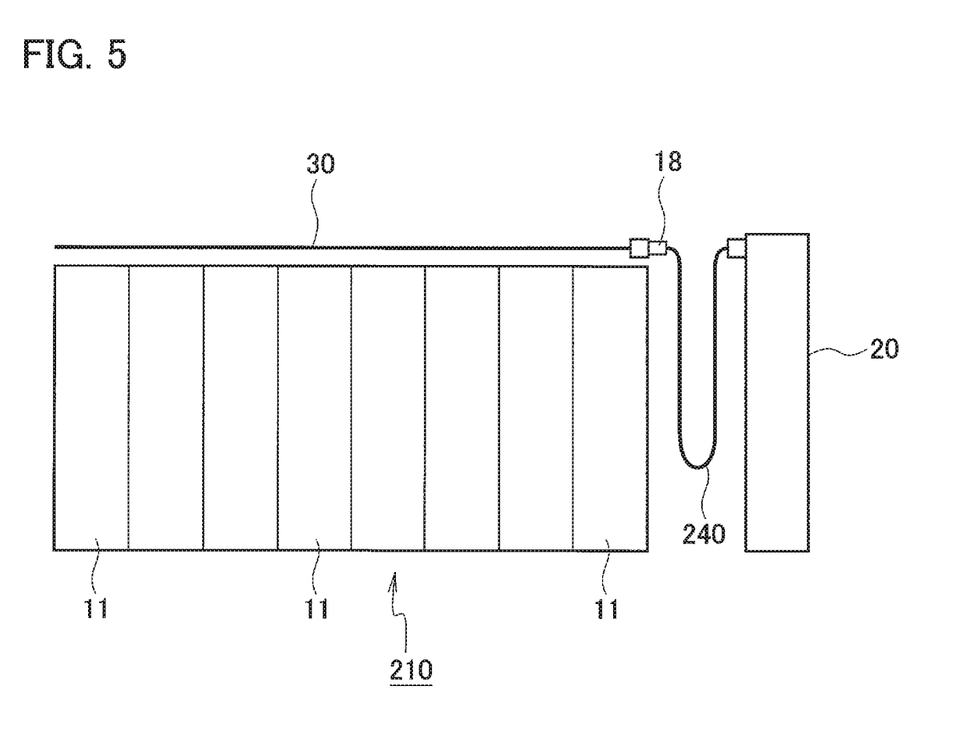
FIG. 5 is a side view schematically illustrating a battery module according to a second embodiment.

FIG. 5 is a side surface view schematically illustrating a battery module according to a second embodiment of the present invention.

In the battery module 210 of the second embodiment, the flexible printed wiring board 240 on the unit side is wired between the battery cells 11 closest to the cell-monitoring unit 20 so as to bent in a U shape, and the cell-monitoring unit 20 and the flexible printed wiring board 240 on the unit side bent in a U shape are electrically connected.

According to the battery module 210 of the second embodiment, the center of the flexible printed wiring board 240 on the cell-monitoring unit side is bent in a U shape and connected to the cell-monitoring unit 20, whereby the same action and effects as that in the first embodiment can be obtained, and is capable of further miniaturize the entire body than the one of the first embodiment.

According to each of the above embodiments, a flexible printed wiring board (FPC) is used as a wiring member that is wired on a plurality of battery cells and electrically connected to each battery cell, but the wiring and/or connecting member is not limited to FPC. Alternatively, a flexible flat cable (FFC), a flat cable (FC), or the like may be used as the wiring and/or connecting member.

According to each of the above embodiments, the connectors are used for connection between the cell-monitoring unit and the flexible printed wiring board or for connection between the flexible printed wiring boards. However, instead of connector connection, connection by insertion of metal pin into a through hole with gold plating on its inner surface, or connection by soldering, thermocompression bonding or the like may be employed.

Furthermore, in the first embodiment, the cell-monitoring unit arranged on the front side (the side closest to the cell-monitoring unit) of the plurality of battery cells has been described. However, the cell-monitoring unit may be arranged above (on the upper surface side) of a plurality of battery cells by bending the flexible printed wiring board on the battery cell side into a U shape.

Embodiments of the present invention have been described above. However, the invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes, which come within the meaning and range of equivalency of the claims, are therefore intended to be embraced therein.

Moreover, the effects described in the embodiments of the present invention are only a list of optimum effects achieved by the present invention. Hence, the effects of the present invention are not limited to those described in the embodiment of the present invention.

What is claimed is:

1. A battery module comprising:
a plurality of battery cells being arrayed;
a cell-monitoring unit being electrically connected to the plurality of battery cells and configured to monitor each battery cell of the plurality of battery cells;
a first battery-side circuit board on a battery cell side and directly connected to the plurality of battery cells;
a second battery-side circuit board on the battery cell side, physically separated from the first battery-side circuit board, and directly connected to the plurality of battery cells;
a cell-monitoring unit side circuit board on a cell-monitoring unit side, physically separated from each of the first battery-side circuit board and the second battery-side circuit board, and electrically connected to each of the cell-monitoring unit, the first battery-side circuit board, and the second battery-side circuit board;
a first connector interconnecting the first battery-side circuit board to the cell-monitoring unit side circuit board by insertions of a first battery side terminal, of the first battery-side circuit board, and a first cell-monitoring unit side terminal of the cell-monitoring unit side circuit board into the first connector; and
a second connector separated from the first connector and interconnecting the second battery-side circuit board to the cell-monitoring unit side circuit board by insertions of a second battery-side terminal, of the second battery-side circuit board, and a second cell-monitoring unit side terminal of the cell-monitoring unit side circuit board into the second connector, wherein
the first battery-side circuit board comprises first battery-side voltage detection lines electrically interconnecting first terminals of the battery cells directly to the first connector,
the second battery-side circuit board comprises second battery-side voltage detection lines electrically interconnecting second terminals of the battery cells directly to the second connector,
the first terminals of the battery cells are on an opposite side of the battery cells as compared to the second terminals,
the cell-monitoring unit side circuit board comprises first cell-monitoring unit side voltage detection lines electrically interconnecting, from the first connector, the first battery-side voltage detection lines to the cell-monitoring unit,
the cell-monitoring unit side circuit board further comprises second cell-monitoring unit side voltage detection lines electrically interconnecting, from the second connector, the second battery-side voltage detection lines to the cell-monitoring unit,
the cell-monitoring unit side circuit board comprising a first side and a second side opposite to the first side,
the first side of the cell-monitoring unit side circuit board faces in a same direction in which a first face, of the first battery-side circuit board and on which the first battery-side voltage detection lines are routed from the first terminals to the first connector, and a second face, of the second battery-side circuit board and on which the second battery-side voltage detection lines are routed from the second terminals to the second connector, are facing,
the second side of the cell-monitoring unit side circuit board faces in an opposite direction that is opposite to the same direction,
the first cell-monitoring unit side voltage detection lines are routed from the first connector to the cell-monitoring unit on only the first side of the cell-monitoring unit side circuit board,
the second cell-monitoring unit side voltage detection lines are routed from the second connector to the cell-monitoring unit on only the second side of the cell-monitoring unit side circuit board, and
along a direction in which interconnections, between the cell-monitoring unit and each of the first cell-monitoring unit side voltage detections lines and the second cell-monitoring unit side voltage detection lines, are arranged, each of the first cell-monitoring unit side voltage detection lines and second cell-monitoring unit side voltage detection lines are interconnected to the cell-monitoring unit, by overlapping each other from respective ones of the first side and second side of the cell-monitoring unit side circuit board, in an order of electric potentials of ones of the battery cells respectively interconnected to the cell-monitoring unit by respective ones of the first cell-monitoring unit side voltage detection lines and second cell-monitoring unit side voltage detection lines.

2. The battery module according to claim 1, wherein
at least one of the first battery-side circuit board and the second battery-side circuit board on the battery cell side is a flexible printed wiring board including a plurality of electric circuits on one surface, and
the cell-monitoring unit side circuit board on the cell-monitoring unit side is a flexible printed wiring board, on opposing surfaces thereof facing in opposite directions from each other, including a plurality of electric circuits.

3. The battery module according to claim 2, wherein
the electric circuits of the at least one of the first battery-side circuit board and the second battery-side circuit board comprise a first row, of rows separately formed by first electrodes of the battery cells, that is electrically connected to one of the electric circuits on a first surface of the opposing surfaces of the cell-monitoring unit side circuit board, and
the electric circuits of the at least one of the first battery-side circuit board and the second battery-side circuit board comprise further comprise a second row, of rows separately formed by second electrodes of the battery cells, that is electrically connected to another of the electric circuits on a second surface of the opposing surfaces of the cell-monitoring unit side circuit board.

4. The battery module according to claim 1, wherein
the cell-monitoring unit side circuit board is bent and wired between the battery cells and the cell-monitoring unit.

5. The battery module according to claim 1,
wherein the battery cells are arrayed in a manner that is extended away from the cell monitoring unit.

6. The battery module according to claim 5,
the first battery-side circuit board and the second battery-side circuit board are respective legs on the battery cell side that are separated by a cutout.

* * * * *